United States Patent
Zhang

(10) Patent No.: US 10,879,917 B2
(45) Date of Patent: Dec. 29, 2020

(54) CRYSTAL OSCILLATOR AND METHOD FOR ADJUSTING OSCILLATION FREQUENCY

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/408,464

(22) Filed: May 10, 2019

(65) Prior Publication Data
US 2019/0305786 A1 Oct. 3, 2019

Related U.S. Application Data

(63) Continuation of application No. PCT/CN2018/081052, filed on Mar. 29, 2018.

(51) Int. Cl.
| | |
|---|---|
| *H03L 7/24* | (2006.01) |
| *H03B 5/32* | (2006.01) |
| *H03K 3/03* | (2006.01) |
| *H03B 5/00* | (2006.01) |
| *H03K 3/012* | (2006.01) |

(Continued)

(52) U.S. Cl.
CPC ............ *H03L 7/24* (2013.01); *H03B 5/00* (2013.01); *H03B 5/06* (2013.01); *H03B 5/32* (2013.01); *H03B 5/366* (2013.01); *H03K 3/012* (2013.01); *H03K 3/0307* (2013.01); *H03B 2200/0012* (2013.01); *H03B 2200/0068* (2013.01); *H03B 2200/0094* (2013.01)

(58) Field of Classification Search
CPC ........ H03K 3/012; H03K 3/0307; H03L 5/00; H03L 7/24; H03B 1/04; H03B 5/00; H03B 5/06; H03B 5/32; H03B 2200/0068; H03B 2200/0012; H03B 2200/0094; H03B 5/366
USPC ............................ 331/109, 116 FE, 158, 183
See application file for complete search history.

(56) References Cited

U.S. PATENT DOCUMENTS

| | | | | |
|---|---|---|---|---|
| 5,047,734 A | * | 9/1991 | Newell | ................ H03B 5/38 331/105 |
| 6,559,730 B1 | | 5/2003 | Marvin et al. | |

(Continued)

FOREIGN PATENT DOCUMENTS

| | | |
|---|---|---|
| CN | 101162888 A | 4/2008 |
| CN | 103346782 A | 10/2013 |
| CN | 103618518 A | 3/2014 |

*Primary Examiner* — Arnold M Kinkead

(57) ABSTRACT

A crystal oscillator and a method are provided for adjusting an oscillation frequency. The crystal oscillator includes: a first oscillator circuit, a frequency control circuit and a crystal; where the first oscillator circuit is configured to output a first drive signal having a first oscillation frequency to drive the crystal, and the frequency control circuit is configured to determine a frequency control amount according to a feature of an electrical signal flowing through the crystal under driving of the first drive signal, and adjust the first oscillation frequency according to the frequency control amount. When the technical solutions are applied to scenarios where the crystal oscillator is enabled to quickly en-oscillate, a natural en-oscillation cycle of the crystal oscillator may be shortened, and the en-oscillation speed is increased.

16 Claims, 6 Drawing Sheets

(51) Int. Cl.
*H03B 5/36* (2006.01)
*H03B 5/06* (2006.01)

(56) References Cited

U.S. PATENT DOCUMENTS

| 6,624,708 B1 * | 9/2003 | Wessendorf ............ H03B 5/36 |
| | | 331/116 R |
| 2008/0100391 A1 | 5/2008 | Lim et al. |
| 2010/0214035 A1 | 8/2010 | Terada et al. |
| 2015/0071394 A1 | 3/2015 | Miyanaga et al. |
| 2016/0105147 A1 | 4/2016 | Matsuo et al. |

* cited by examiner

CRYSTAL OSCILLATOR AND METHOD FOR ADJUSTING OSCILLATION FREQUENCY

CROSS REFERENCE TO RELATED APPLICATIONS

The present application is a continuation of international application No. PCT/CN2018/081052, filed on Mar. 29, 2018, which is hereby incorporated by reference in its entirety.

TECHNICAL FIELD

Embodiments of the present disclosure relate to the technical field of circuits, and in particular, relate to a crystal oscillator and a method for adjusting an oscillation frequency.

BACKGROUND

Crystal oscillators are also called as quartz resonators, which are fabricated from quartz crystal sheets having a piezoelectric effect. Such quartz crystal sheets may generate mechanical vibrations under the effect of an externally applied alternative electric field. When a frequency of the alternative electrical field is the same as an inherited frequency of the quartz crystal, the vibrations are severe, which is a reflection of a crystal resonance feature. Based on this feature, an LC (coil and capacitor) resonant loop, a filter or the like may be replaced by the quartz resonator.

However, generally the crystal oscillator has a long cycle for natural en-oscillation. According to the statistics, over 10000 cycles are needed before en-oscillation. As a result, the crystal oscillator has a low en-oscillation speed.

SUMMARY

In view of the above, one technical problem to be solved by embodiments of the present disclosure is to provide a crystal oscillator and a method for adjusting an oscillation frequency, to address or mitigate the above defects in the related art.

Embodiments of the present disclosure provide a crystal oscillator. The crystal oscillator includes: a first oscillator circuit, a frequency control circuit and a crystal; where the first oscillator circuit is configured to output a first drive signal having a first oscillation frequency to drive the crystal, and the frequency control circuit is configured to determine a frequency control amount according to a feature of an electrical signal flowing through the crystal under driving of the first drive signal, and adjust the first oscillation frequency according to the frequency control amount.

Optionally, in accordance with an embodiment, the frequency control circuit is further configured to determine the frequency control amount according to a feature of a current flowing through the crystal under driving of the first drive signal.

Optionally, in an embodiment, the frequency control circuit is further configured to determine the frequency control amount according to an envelop frequency of the electrical signal flowing through the crystal under driving of the first drive signal.

Optionally, the crystal oscillator further includes in accordance with an embodiment: a conversion circuit; where the conversion circuit is configured to convert the first oscillation frequency into a first control signal and convert the frequency control amount into a frequency control signal, and the frequency control circuit is further configured to adjust the first oscillation frequency according to the first control signal and the frequency control signal.

Optionally, the frequency control circuit in accordance with an embodiment is further configured to determine an injection control signal according to the first control signal and the frequency control signal, and obtain an adjusted first oscillation frequency according to the injection control signal.

Optionally, the crystal oscillator further includes in accordance with an embodiment: a first detection circuit; where the first detection circuit is configured to detect the electrical signal flowing through the crystal.

Optionally, the crystal oscillator further includes in accordance with an embodiment: a second detection circuit; where the second detection circuit is configured to detect the feature of the electrical signal flowing through the crystal.

Optionally, the frequency control circuit in accordance with an embodiment is further configured to determine the frequency control amount according to a variation trend of the feature of the electrical signal flowing through the crystal under driving of the first drive signal.

Optionally, in accordance with an embodiment, if an absolute value of a difference between the first oscillation frequency and a resonant frequency of the crystal is greater than a predetermined threshold, the frequency control amount is decreased to lower the first oscillation frequency; or if the absolute value of the difference between the first oscillation frequency and the resonant frequency of the crystal is less than the predetermined threshold, the frequency control amount is increased to increase the first oscillation frequency.

Optionally, the crystal oscillator further includes in accordance with an embodiment: a second oscillator circuit bridged at two ends of the crystal; where the second oscillator circuit is configured to enable the crystal oscillator to en-oscillate if the first oscillation frequency matches the resonant frequency of the crystal.

Optionally, in accordance with an embodiment, in the process of adjusting the first oscillation frequency, the second oscillator circuit is in a shutdown state; and the first oscillator circuit and the frequency control circuit are in a shutdown state if the first oscillation frequency matches the resonant frequency of the crystal.

Optionally, the feature of the electrical signal flowing through the crystal is an envelop frequency in accordance with an embodiment.

In accordance with yet another embodiment, a method for adjusting an oscillation frequency is provided. The method includes:

driving a crystal by a first drive signal having a first oscillation frequency;

determining a frequency control amount according to a feature of an electrical signal flowing through the crystal under driving of the first drive signal; and adjusting the first oscillation frequency according to the frequency control amount.

Optionally, in accordance with an embodiment of the present disclosure, the method further includes:

converting the first oscillation frequency into a first control signal, and converting the frequency control amount into a frequency control signal;

where, correspondingly, the adjusting the first oscillation frequency according to the frequency control amount includes: adjusting the first oscillation frequency according to the first control signal and the frequency control signal.

Optionally, in accordance with an embodiment, the adjusting the first oscillation frequency according to the first control signal and the frequency control signal includes: determining an injection control signal according to the first control signal and the frequency control signal, and obtaining an adjusted first oscillation frequency according to the injection control signal.

Optionally, in accordance with an embodiment, the method further includes: detecting the electrical signal flowing through the crystal, and/or detecting the feature of the electrical signal flowing through the crystal.

Optionally, in accordance with an embodiment, the determining a frequency control amount according to a feature of an electrical signal flowing through the crystal under driving of the first drive signal includes: determining the frequency control amount according to a variation trend of the feature of the electrical signal flowing through the crystal under driving of the first drive signal.

Optionally, in accordance with an embodiment, if an absolute value of a difference between the first oscillation frequency and a resonant frequency of the crystal is greater than a predetermined threshold, the frequency control amount is decreased to lower the first oscillation frequency; or if the absolute value of the difference between the first oscillation frequency and the resonant frequency of the crystal is less than the predetermined threshold, the frequency control amount is increased to increase the first oscillation frequency.

Optionally, in accordance with an embodiment, the method further includes: enabling the crystal oscillator to en-oscillate if the first oscillation frequency matches the resonant frequency of the crystal.

Optionally, in accordance with an embodiment, in the process of adjusting the first oscillation frequency, the second oscillator circuit is shut down; and the first oscillator circuit and the frequency control circuit are shut down if the first oscillation frequency matches the resonant frequency of the crystal.

In the technical solutions according to the embodiments of the present application, since the first oscillator circuit output the first drive signal having the first oscillation frequency to drive the crystal, and the frequency control circuit determines the frequency control amount according to the feature of the electrical signal flowing through the crystal under driving of the first drive signal and adjusts the first oscillation frequency according to the frequency control amount, when the technical solutions are applied to scenarios where the crystal oscillator is enabled to quickly en-oscillate, a natural en-oscillation cycle of the crystal oscillator may be shortened, and the en-oscillation speed is increased.

BRIEF DESCRIPTION OF THE DRAWINGS

Some specific embodiments of the present disclosure are described in detail hereinafter in an exemplary manner instead of a non-limitative manner with reference to the accompanying drawings. In the drawings, like reference numerals denote like or similar parts or elements. A person skilled in the art should understand that these drawings are drawn to scale. Among the drawings.

DETAILED DESCRIPTION

Nevertheless, it is not necessary to require that any technical solution according to the embodiments of the present disclosure achieves all of the above technical effects.

For better understanding of the technical solutions of the embodiments of the present disclosure by a person skilled in the art, the technical solutions of the present disclosure are clearly and completely described with reference to the accompanying drawings of the embodiments of the present disclosure. Apparently, the described embodiments are only a part of the embodiments of the present disclosure, rather than the entire embodiments. Based on the embodiments of the present disclosure, all other embodiments derived by persons of ordinary skill in the art without any creative efforts shall fall within the protection scope of the present disclosure.

Specific implementations of the embodiments of the present disclosure are further described hereinafter with reference to the accompanying drawings of the present disclosure.

Figure 1:
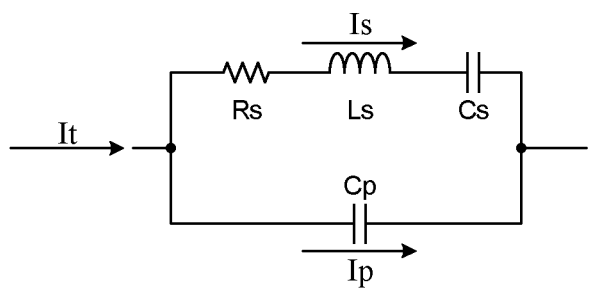
FIG. 1 is a schematic structural diagram of an equivalent circuit of a crystal according to a first embodiment of the present disclosure.

FIG. 1 is a schematic structural diagram of an equivalent circuit of a crystal according to a first embodiment of the present disclosure. As illustrated in FIG. 1, in this embodiment, root causes to a long en-oscillation cycle of a crystal oscillator including the crystal are analyzed in detail according to the equivalent circuit of the crystal.

As illustrated in FIG. 1, the equivalent circuit of the crystal includes a series branch and a parallel branch. The series branch includes a resistor $R_S$, an inductor $L_S$ and a capacitor $C_S$ that are connected in series. The parallel branch includes a capacitor $C_P$ that is connected in parallel to the series branch. An input current of the crystal is $I_r$. A resonant current $I_S$ is present in the series branch, and a spike current $I_P$ is present in the parallel branch. Since the capacitor $C_P$ is far greater than the capacitor $C_S$, the en-oscillation cycle of the crystal oscillator including the crystal is long, that is, an en-oscillation speed is low.

To address the defect that the en-oscillation cycle of the crystal oscillator due to the crystal as illustrated in FIG. 1, an embodiment of the present disclosure provides two solutions. In the first solution, a greater voltage step excitation is injected to both terminals of the crystal. In the second solution, a drive signal is provided for the crystal or energy is constantly injected by using a relaxation oscillator circuit (or an adjustable oscillator circuit) having an oscillation frequency quite approaching the resonant frequency.

However, with respect to the first solution, since a transistor (for example, a MOS transistor) in a core oscillator circuit (which is also referred to as a crystal oscillator circuit) needs to great step voltage to ensure a high initial energy whereas the transistor itself has a limited voltage-withstand capability, the greater voltage step excitation is subject to an amplitude upper limit, such that a final injection effect of the method is restricted.

With respect to the second solution, since a ratio (which is referred to as a Q value) of an inductive reactance presented by the series branch in the equivalent circuit of the crystal to an equivalent loss resistance thereof is very high, it means that a frequency selective bandwidth of the crystal resonator is very narrow. However, due to impacts caused by the process, temperature and power source voltage, a central frequency of the relaxation oscillator circuit may be greatly changed, such that an oscillation frequency of the relaxation oscillator circuit may hardly reach the resonance frequency.

Figure 2:
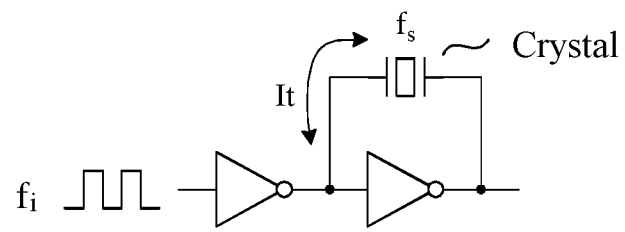
FIG. 2 is a schematic diagram of a brief model of a crystal oscillator according to a second embodiment of the present disclosure.
Figure 3:
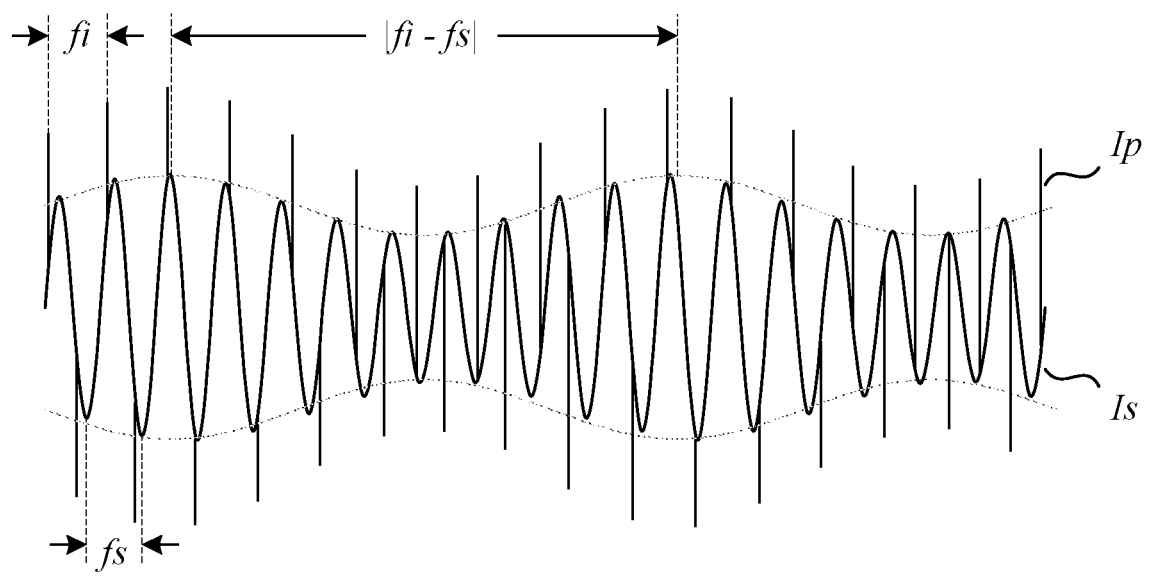
FIG. 3 is a schematic diagram of a current flowing through a crystal according to a third embodiment of the present disclosure.

FIG. 2 is a schematic diagram of a brief model of a crystal oscillator according to a second embodiment of the present disclosure. As illustrated in FIG. 2, the brief model of the crystal oscillator includes two amplifiers and one crystal. A drive signal having an oscillation frequency of $f_i$ is applied to a leftmost amplifier, and a current flowing through the crystal is detected as illustrated in FIG. 3. FIG. 3 is a schematic diagram of a current flowing through a crystal according to a third embodiment of the present disclosure. With reference to FIG. 1, the current flowing through the crystal includes a resonant current $I_S$ and a spike current $I_P$. With respect to the spike current $I_P$, since only one capacitor $C_P$ is arranged in the parallel branch, an abrupt current $C_P \cdot dV/dt$ may be generated at two terminals of the capacitor $C_P$, that is, the spike current $I_P$. With respect to the series branch, the serial branch is practically an LCR circuit. Therefore, in the branch, a voltage response (the resonant current $I_S$) of the current to two poles of the crystal is a ringing sinusoidal wave. Since the Q value of the series branch is very high, the resonant current $I_S$ has a very small attenuation hundreds or even thousands of cycles later.

However, still referring to FIG. 3, in a time domain, since the oscillation frequency $f_i$ is generally inconsistent with the resonant frequency $f_s$, the drive signal having the oscillation frequency of $f_i$ is divided into step signals with a time interval of $1/f_i$, and finally the current (that is, the resonant current $I_S$) in the parallel branch in the equivalent circuit of the crystal is a superimposition of responses of a series of step signals in the LCR circuit. Since the oscillation frequency $f_i$ is different from the resonant frequency $f_s$, at some time points, a minimum value or a maximum value with superimposed amplitudes is rightly present in the resonant current $I_S$. A time interval between the maximum value and the minimum value is a least common multiple for $1/f_i$ and $1/f_s$. In this way, an envelope of the sinusoidal wave is formed.

According to the analysis in FIG. 1 to FIG. 3, the embodiments hereinafter exemplarily illustrate the crystal oscillator, the method for adjusting an oscillation frequency and the like according to the embodiments of the present disclosure.

Figure 4:
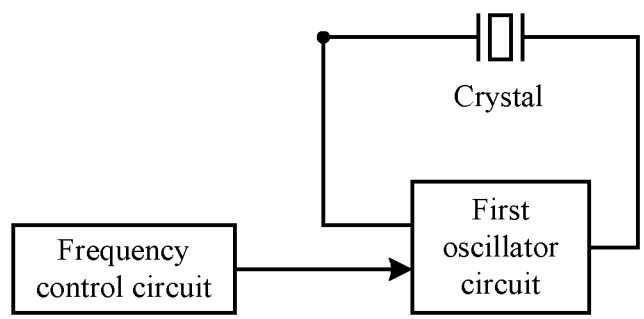
FIG. 4 is a schematic structural diagram of a crystal oscillator according to a fourth embodiment of the present disclosure.

FIG. 4 is a schematic structural diagram of a crystal oscillator according to a fourth embodiment of the present disclosure. As illustrated in FIG. 4, 4. the crystal oscillator according to this embodiment includes: a first oscillator circuit, a frequency control circuit and a crystal; where the first oscillator circuit is configured to output a first drive signal having a first oscillation frequency to drive the crystal which is also referred to as injecting energy to the crystal; and the frequency control circuit is configured to determine a frequency control amount according to a feature of an electrical signal flowing through the crystal under driving of the first drive signal, and adjust the first oscillation frequency according to the frequency control amount.

In this embodiment, the frequency control circuit is further configured to determine a frequency control amount according to a feature of a current flowing through the crystal under driving of the first drive signal. That is, the electrical signal flowing through the crystal may be a current flowing through the crystal, for example, a resonant current.

In another embodiment, the frequency control circuit is further configured to determine the frequency control amount according to an envelop frequency of the electrical signal flowing through the crystal under driving of the first drive signal.

In this embodiment, the first oscillator circuit may be specifically a relaxation oscillator circuit (or referred to as an adjustable oscillator circuit). When the crystal oscillator is powered on and operates, the first oscillation frequency may be a default frequency at which the relaxation oscillator circuit provides a drive signal for the crystal. The frequency control module adjusts the default frequency according to the frequency control amount, such that the first oscillation frequency approaches the resonant frequency of the crystal as illustrated in FIG. 4 to obtain an initial first oscillation frequency. If the initial first oscillation frequency still does not approach the resonant frequency of the crystal, a second adjustment is performed for the first oscillation frequency. The frequency at which the relaxation oscillator circuit provides the drive signal is the initial first oscillation frequency, and analogously, until the first oscillation frequency approaches to the greatest extent the resonant frequency of the crystal is determined such that the crystal oscillator quickly en-oscillates. Specifically, the adjustable oscillator circuit may be a voltage controlled oscillator (VCO) or a digital controlled oscillator (DCO).

Figure 5:
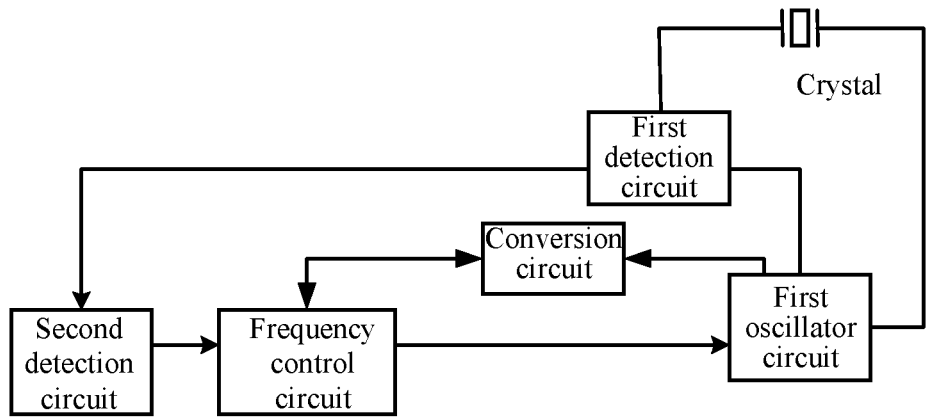
FIG. 5 is a schematic structural diagram of a crystal oscillator according to a fifth embodiment of the present disclosure.

FIG. 5 is a schematic structural diagram of a crystal oscillator according to a fifth embodiment of the present disclosure. As illustrated in FIG. 5, in addition to the first oscillator circuit, the frequency control circuit and the crystal, the crystal oscillator according to this embodiment further includes: a conversion circuit; where the conversion circuit is configured to convert the first oscillation frequency into a first control signal, and converts the frequency control amount into a frequency control signal. The first control signal and the frequency control signal may be a current signal or may be a digital signal.

In this embodiment, the conversion circuit may specifically includes an analog-to-digital conversion unit and a fast Fourier transformation unit; where the analog-to-digital conversion unit is specifically configured to convert the first oscillation frequency into a first control signal, and the fast Fourier transformation unit is specifically configured to convert the frequency control amount into a frequency control signal.

It should be noted that the conversion circuit and the frequency control circuit may be integrally arranged, or the functions of the conversion circuit are directly integrated in the frequency control circuit; or the conversion circuit and a second detection circuit may be integrally arranged, or the functions of the conversion circuit are directly integrated in the second detection circuit. Nevertheless, a part of the units included in the conversion circuit may be integrated in the second detection circuit, and the remaining units included in the conversion circuit may be integrated in the frequency control circuit.

In this embodiment, the frequency control circuit is further configured to adjust the first frequency oscillation frequency according to the first control signal and the frequency control signal.

Specifically, in this embodiment, the frequency control circuit is further configured to determine an injection control signal according to the first control signal and the frequency control signal, and adjust the first oscillation frequency according to the injection control signal, such that a first oscillation frequency that approaches to the greatest extent to the resonant frequency is obtained, thereby enabling the crystal oscillator to quickly en-oscillate.

Further, in this embodiment, the crystal oscillator further includes: a first detection circuit, for example, a resistor; where the first detection circuit is configured to detect the electrical signal flowing through the crystal. In some specific application scenarios, the first detection circuit may only implement the function of electrical signal detection. In this case, the first detection circuit is also referred to as an electrical signal detection circuit. Nevertheless, if in some other specific application scenarios, the first detection circuit also needs to implement other functions in addition to the function of electrical signal detection, switchover between the function of electrical signal detection and the other functions may be implemented by modifying a circuit structure of the first detection circuit based on switch-on or switch-off of a switch device.

Further, in this embodiment, the crystal oscillator further includes: a second detection circuit, for example, a diode or an active envelope detection circuit; where the second detection circuit is configured to detect the feature of the electrical signal flowing through the crystal. In some specific application scenarios, the second detection circuit may only implement the function of feature detection. In this case, the second detection circuit is also referred to as a feature detection circuit. Nevertheless, if in some other specific application scenarios, the second detection circuit also needs to implement other functions in addition to the function of feature detection, switchover between the function of feature detection and the other functions may be implemented by modifying a circuit structure of the second detection circuit based on switch-on or switch-off of a switch device.

Specifically, in this embodiment, the frequency control circuit is further configured to determine the frequency control amount based on a variation trend of the feature of the electrical signal flowing through the crystal under driving of the first drive signal, and adjust the first oscillation frequency based on the frequency control amount.

Optionally, if an absolute value of a difference between the first oscillation frequency and a resonant frequency of the crystal is greater than a predetermined threshold, the frequency control amount is decreased to lower the first oscillation frequency during determining the adjusted first oscillation frequency; or if the absolute value of the difference between the first oscillation frequency and the resonant frequency of the crystal is less than the predetermined threshold, the frequency control amount is increased to increase the first oscillation frequency during determining the adjusted first oscillation frequency.

With reference to FIG. 3, the envelope frequency is an absolute value of the difference between the first oscillation frequency and the resonant frequency. Therefore, if the envelope frequency is greater than a predefined threshold, the first control signal is subtracted from a control signal converted from the currently detected envelope frequency to obtain a frequency control signal, and the first oscillator circuit continues to adjust the first oscillation frequency based on the frequency control signal. If the envelope frequency is less than the predefined threshold, the first control signal is added to the control signal converted from the currently detected envelope frequency to obtain a frequency control signal, and the first oscillator circuit continues to adjust the first oscillation frequency based on the frequency control signal. The technical process is repeatedly performed until the envelope frequency is equal to the predefined threshold. In this case, it may be considered that the first oscillation frequency approaches to the greatest extent the resonant frequency of the crystal.

The technical process of determining the difference between the first oscillation frequency and the resonant frequency may be performed by a processor, an MCU or a DSP. In specific practice, the processor may be integrated on the frequency control circuit, or may be separated from the frequency control circuit.

In another embodiment, the threshold may have an upper limit and a lower limit. If the envelope frequency is greater than a predefined threshold upper limit, the first control signal is subtracted from a control signal converted from the currently envelope frequency to obtain a frequency control signal. If the envelope frequency is less than a predefined threshold lower limit, the first control signal is added to the control signal converted from the currently detected envelope frequency to obtain a frequency control signal.

Figure 6:
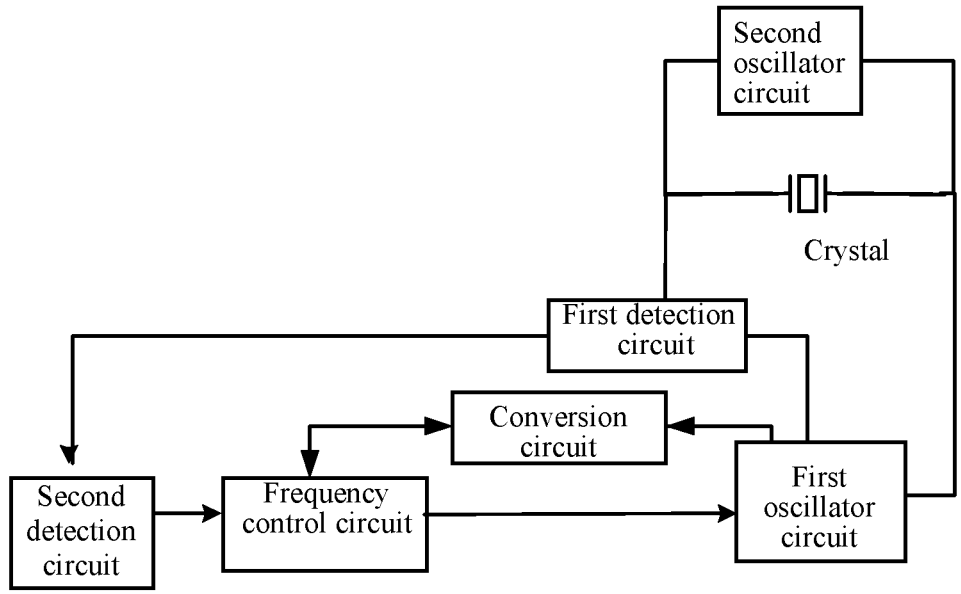
FIG. 6 is a schematic structural diagram of a crystal oscillator according to a sixth embodiment of the present disclosure.

FIG. 6 is a schematic structural diagram of a crystal oscillator according to a sixth embodiment of the present disclosure. As illustrated in FIG. 6, in this embodiment, the crystal oscillator further includes a second oscillator circuit in addition to the first oscillator circuit, the frequency control circuit, the crystal, the conversion circuit, the first detection circuit and the second detection circuit. The second oscillator circuit is configured to enable the crystal oscillator to en-oscillate if the first oscillation frequency matches the resonant frequency of the crystal.

In this embodiment, if the second oscillator circuit only enables the crystal oscillator to en-oscillate, the second oscillator circuit may also be referred to as a core oscillator circuit or a crystal oscillator circuit, which may be specifically a pierce oscillator circuit, santos oscillator circuit and the like.

Optionally, in an embodiment of the present disclosure, in the process of adjusting the first oscillation frequency, the second oscillator circuit is in a shutdown state; and the first oscillator circuit and the frequency control circuit are in a shutdown state if the first oscillation frequency matches the resonant frequency of the crystal, for example, the first oscillation frequency is absolutely consistent with or approximately consistent with the resonant frequency of the crystal. If the conversion circuit, the first detection circuit, the second detection circuit and the like are included, these circuits are also in a shutdown state. That is, except the crystal and the second oscillator circuit, the other circuits in the crystal oscillator are in the shutdown state.

Hereinafter, description is given as how to control the first oscillator circuit, the frequent control circuit, the conversion circuit, the first detection circuit and the second detection circuit to be in an operating state and control the second oscillator circuit to be in a shutdown state, and how to control the first oscillator circuit, the frequency control circuit, the crystal, the conversion circuit, the first detection circuit and the second detection circuit to be in the shutdown state and control the second oscillator circuit to be in the operating state.

In this case, state control signals run, _run and tri are introduced, and values are assigned to the state control signals run, _run and tri to control the corresponding circuit to be in the shutdown state or in the operating state. That is, this case may also be understood as introducing a first state control signal run, a second state control signal _run and a third state control signal tri to control the corresponding circuit to be in the shutdown state or in the operating state. The first state control signal is configured to control the second oscillator circuit to be in the operating state or in the shutdown state, and the second state control signal is configured to control the first oscillator circuit, the frequency control circuit, the conversion circuit, the first detection circuit and the second detection circuit to be in the operating state or in the shutdown state. In addition, the third state control signal is configured to, under cooperation with the second state control signal, control the conversion circuit to be in the operating state or in the shutdown state.

Specifically, in an initial state, the state control signal run is set to 0 such that the second oscillator circuit is in the shutdown state, and the state control signal _run is set to 1 such that the first oscillator circuit, the frequency control circuit, the conversion circuit, the first detection circuit and the second detection circuit are in the operating state. In addition, when the conversion circuit is in the operating state, the state control signal tri is set to 0, and in this case, the frequency control circuit drives the crystal by a drive signal having a default frequency. That is, in this case, the first oscillation frequency is the default frequency, and where the conversion circuit needs to perform conversion, the state control signal tri is set to 1 such that a conversion process is started. In the meantime, referring to the relation between the envelope frequency and the predefined threshold, the first oscillation frequency is adjusted until a finally obtained first oscillation frequency is absolutely consistent or approximately consistent with the resonant frequency. In this case, the state control signal run is set to 1 such than the second oscillator circuit is in the operating state, and the state control signal _run is set to 0 such that the first oscillator circuit, the frequency control signal, the conversion circuit, the first detection circuit and the second detection circuit are in the shutdown state. In this case, the state control signal tri maybe defaulted.

Figure 7:
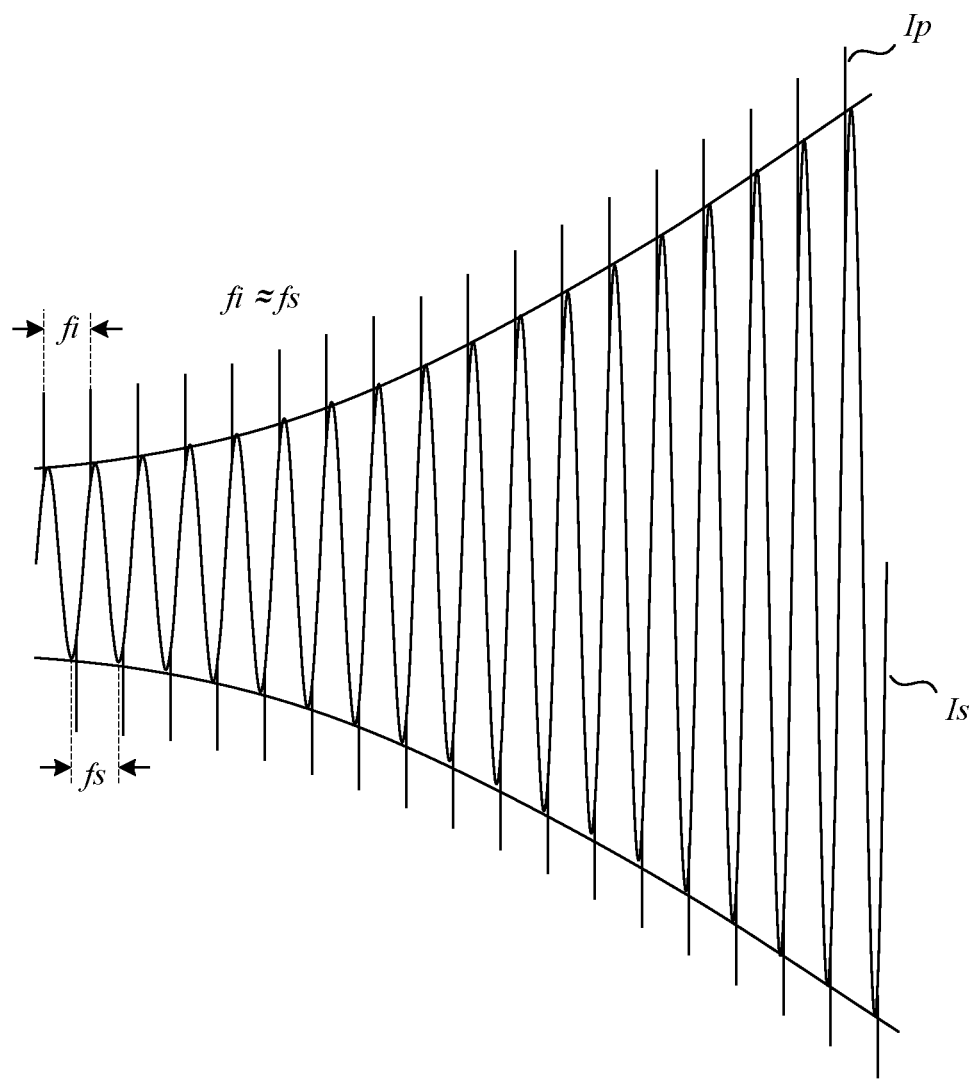
FIG. 7 is a schematic diagram of a resonant current when a first oscillation frequency is consistent or approximately consistent with a resonant frequency according to a seventh embodiment of the present disclosure.

FIG. 7 is a schematic diagram of a resonant current when a first oscillation frequency is consistent or approximately consistent with a resonant frequency according to a seventh embodiment of the present disclosure. The first oscillation frequency may be absolutely consistent or approximately consistent with the resonant frequency, for example, when the threshold is set to 0, it indicates that the first oscillation frequency is absolutely consistent with the resonant frequency, and when the threshold is set to a non-zero value, it indicates that the first oscillation frequency is approximately consistent with the resonant frequency. In this way, quick en-oscillation may be achieved. Relative to FIG. 3, an en-oscillation state, that is, the state as illustrated in FIG. 7, may be enabled through multiple illustrations of the envelope frequency.

In the above embodiment, the circuit structure is only schematically and exemplarily divided. However, in practice, the functions of the first detection circuit, the second detection circuit and the conversion circuit may be integrated in the first oscillator circuit. In addition, the frequency control circuit and the like may also be integrated in the first oscillator circuit. Alternatively, the first detection circuit, the second detection circuit and the like may also be integrated in the frequency control circuit. Therefore, the division of the circuit structure is not specifically defined, and consideration is mainly placed to division of the circuit structure based on practice of the above technical process.

Figure 8:
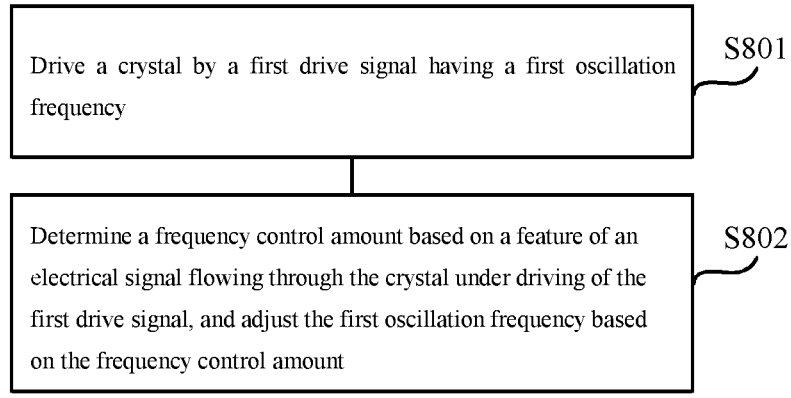
FIG. 8 is a schematic flowchart of a method for adjusting an oscillation frequency according to an eighth embodiment of the present disclosure.

FIG. 8 is a schematic flowchart of a method for adjusting an oscillation frequency according to an eighth embodiment of the present disclosure. Corresponding to the crystal oscillator as illustrated in FIG. 4, the method as illustrated in FIG. 8 includes the following steps:

S801: A crystal is driven by a first drive signal having a first oscillation frequency.

As described above, when the crystal oscillator is initially started, the crystal is driven by the first drive signal having the default frequency, or the crystal is drive by the first drive signal having the first oscillation frequency that is defaulted. The default frequency is adjusted based on the relation between the envelope frequency and the predefined threshold to obtain an initial first oscillation frequency. If the obtained initial first oscillation frequency and the resonant frequency do not satisfy the objective of the quick en-oscillation, when the first oscillation frequency is adjusted at a second time, the crystal is driven by a drive signal having the initial first oscillation frequency, and so on until the determined final first oscillation frequency is consistent or approximately consistent with the resonant frequency of the crystal to be greatest extent, such that the objective of quick en-oscillation of the crystal oscillator is achieved.

As described above, the execution subject of step S801 in this embodiment may be the above first oscillator circuit.

S802: A frequency control amount is determined based on a feature of an electrical signal flowing through the crystal under driving of the first drive signal, and the first oscillation frequency is adjusted based on the frequency control amount.

As described above, the electrical signal may be a current, and the feature may be specifically an envelope frequency.

In this embodiment, the execution subject of step S802 may be the frequency control circuit. The detailed description or interpretation may be referenced to the disclosure in FIG. 4.

Figure 9:
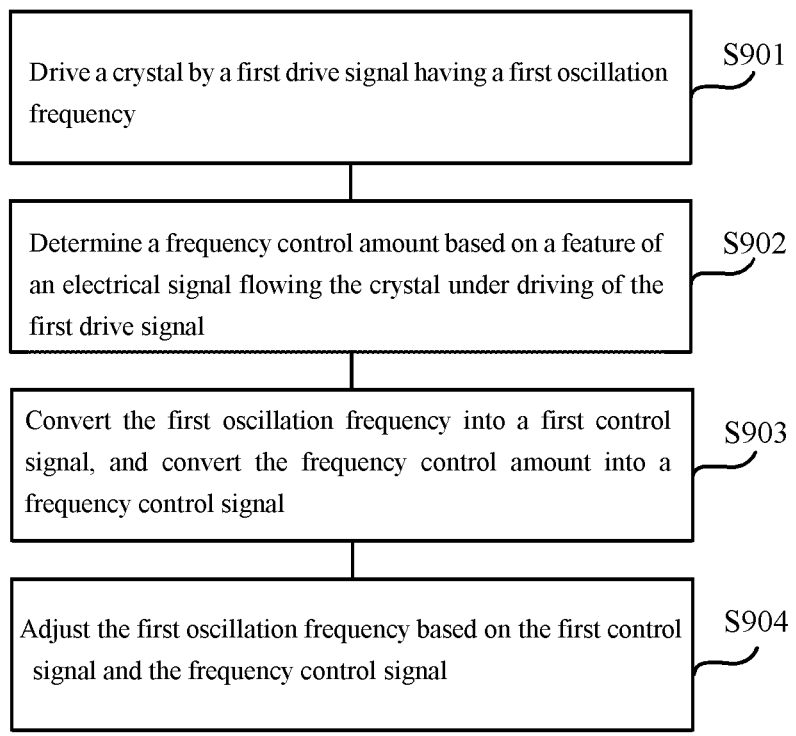
FIG. 9 is a schematic flowchart of a method for adjusting an oscillation frequency according to a ninth embodiment of the present disclosure.

FIG. 9 is a schematic flowchart of a method for adjusting an oscillation frequency according to a ninth embodiment of the present disclosure. As illustrated in FIG. 9, the method includes the following steps:

S901: A crystal is driven by a first drive signal having a first oscillation frequency.

S902: A frequency control amount is determined based on a feature of an electrical signal flowing through the crystal under driving of the first drive signal.

Steps S901 and S902 may be referenced to the related disclosure in FIG. 7.

S903: The first oscillation frequency is converted into a first control signal, and the frequency control amount is converted into a frequency control signal.

In this embodiment, the process of converting the frequency into the control signal in step S903 may be referenced to the disclosure in the embodiment as illustrated in FIG. 5.

S904: The first oscillation frequency is adjusted based on the first control signal and the frequency control signal.

In this embodiment, step S904 may specifically includes: determine an injection control signal based on the first control signal and the frequency control signal, and obtain an adjusted first oscillation frequency based on the injection control signal.

In this embodiment, between step S901 and step S902, the method may further include: detecting the electrical signal flowing through the crystal, and/or detecting the feature of the electrical signal flowing through the crystal. Detection of the electrical signal may be practiced by the first detection circuit, and detection of the feature may be practiced by the second detection circuit.

Specifically, step S904 may include: determine the frequency control amount based on a variation trend of the feature of the electrical signal flowing through the crystal under driving of the first drive signal, and adjust the first oscillation frequency based on the frequency control amount. Optionally, if an absolute value of a difference between the first oscillation frequency and a resonant frequency of the crystal is greater than a predetermined threshold, the frequency control amount is decreased to lower the first oscillation frequency during determining the adjusted first oscillation frequency; or if the absolute value of the difference between the first oscillation frequency and the resonant frequency of the crystal is less than the predetermined threshold, the frequency control amount is increased to increase the first oscillation frequency during determining the adjusted first oscillation frequency.

The detailed description or interpretation of step S904 may be referenced to the disclosure in the embodiments as illustrated in FIG. 3 and FIG. 5.

Figure 10:
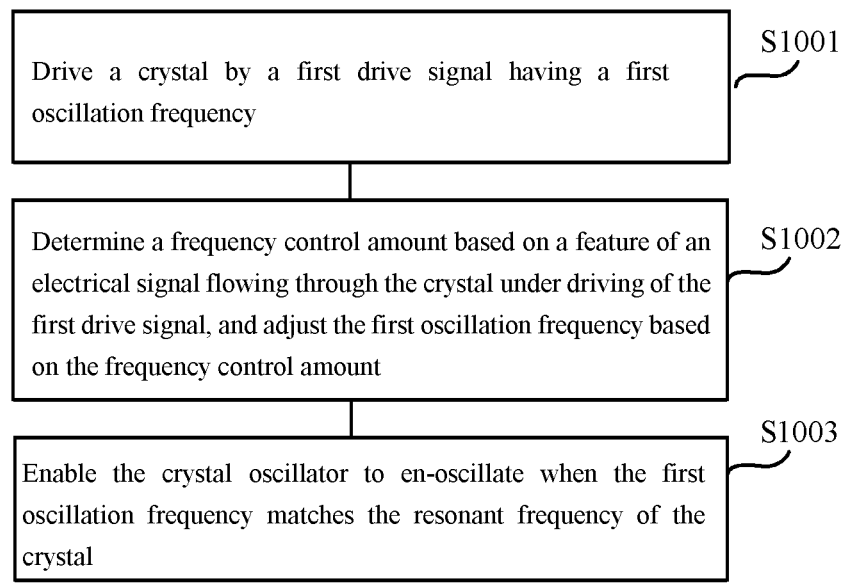
FIG. 10 is a schematic flowchart of a method for adjusting an oscillation frequency according to a tenth embodiment of the present disclosure.

FIG. 10 is a schematic flowchart of a method for adjusting an oscillation frequency according to a tenth embodiment of the present disclosure. As illustrated in FIG. 10, the method includes the following steps:

S1001: A crystal is driven by a first drive signal having a first oscillation frequency.

S1002: A frequency control amount is determined based on a feature of an electrical signal flowing through the crystal under driving of the first drive signal, and the first oscillation frequency is adjusted based on the frequency control amount.

S1003: The crystal oscillator is enabled to en-oscillate when the first oscillation frequency matches the resonant frequency of the crystal.

In this embodiment, in the process of adjusting the first oscillation frequency in steps S1001 to S1002, the second oscillator circuit is shut down; and the first oscillator circuit and the frequency control circuit are shut down if the first oscillation frequency matches the resonant frequency of the crystal in step S1003.

It should be noted that the shutdown state in the above embodiments may include a shutdown state with the power source being cut off, and a standby state with the power source being connected.

In addition, in the above embodiment, the first oscillator circuit may be a voltage controlled oscillator (VCO) or a digital control oscillator (DCO).

In the technical solutions according to the embodiments, since the first oscillator circuit output the first drive signal having the first oscillation frequency to drive the crystal, and the frequency control circuit determines the frequency control amount based on the feature of the electrical signal flowing through the crystal under driving of the first drive signal and adjusts the first oscillation frequency based on the frequency control amount, when the technical solutions are applied to scenarios where the crystal oscillator is enabled to quickly en-oscillate, a natural en-oscillation cycle of the crystal oscillator may be shortened, and the en-oscillation speed is increased.

The technical solutions according to the above embodiments may also be applied to various scenarios where en-oscillation is controllable based on the actual needs, for example, a scenario where an en-oscillation speed of the crystal oscillator may be randomly controlled.

The crystal oscillator circuit and the method for adjusting an oscillation frequency according to the above embodiments may be applied to a specific electronic device, for example, a mobile phone, a bracelet, an earphone or the like, still for example, a fingerprint module, a heart rate detection module or the like.

The above described apparatus embodiments are merely for illustration purpose only. The modules which are described as separate components may be physically separated or may be not physically separated, and the components which are illustrated as modules may be or may not be physical modules, that is, the components may be located in the same position or may be distributed into a plurality of network modules. A part or all of the modules may be selected according to the actual needs to achieve the objectives of the technical solutions of the embodiments. Persons of ordinary skill in the art may understand and implement the present disclosure without paying any creative effort.

According to the above embodiments of the present disclosure, a person skilled in the art may clearly understand that the embodiments of the present disclosure may be implemented by means of hardware or by means of software plus a necessary general hardware platform. Based on such understanding, portions of the technical solutions of the present disclosure that essentially contribute to the related art may be embodied in the form of a software product, the computer software product may be stored in a computer readable storage medium. The computer-readable storage medium includes any mechanism for storing or transferring information in a computer readable form. For example, the computer-readable medium includes a read-only memory (ROM), a random access memory (RAM), a disk storage medium, an optical storage medium, a flash storage medium, electricity, light, sound and other forms of propagation signals (for example, a carrier, an infrared signal, a digital signal and the like), and the like. The computer software product includes several instructions for instructing a computer device (which may be a personal computer, a server, or a network device) to perform all the embodiments or some parts of the embodiments.

A person skilled in the art shall understand that the embodiments may be described to illustrate methods, apparatuses (devices), or computer program products. Therefore, hardware embodiments, software embodiments, or hardware-plus-software embodiments may be used to illustrate the embodiments of the present disclosure. In addition, the embodiments of the present disclosure may further employ a computer program product which may be implemented by at least one computer-readable storage medium with an executable program code stored thereon. The computer-readable storage medium includes, but not limited to, a disk memory, a CD-ROM, an optical memory and the like.

The embodiments of the present disclosure are described based on the flowcharts and/or block diagrams of the method, apparatus (device), and computer program product according to the embodiments of the present disclosure. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a computer-readable memory capable of causing a computer or other programmable data processing devices to work in a specific mode, such that the instructions stored on the computer-readable memory implement a product including an instruction apparatus, where the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Finally, it should be noted that the above embodiments are merely intended to describe the technical solutions of the embodiments of the present disclosure, instead of limiting the present disclosure. Although the present disclosure is described in detail with reference to the above embodiments, persons of ordinary skill in the art should understand that various modifications may be made to the technical solutions described in the above embodiments or equivalent replacements may be made to some technical features thereof, without departing from the spirit and scope of the technical solutions of the embodiments of the present disclosure.

What is claimed is:

1. A crystal oscillator, comprising:
    a crystal;
    a first oscillator circuit, configured to output a first drive signal having a first oscillation frequency to drive the crystal; and
    a frequency control circuit, configured to determine a frequency control amount according to an envelope frequency of a current flowing through the crystal driven by the first drive signal, and adjust the first oscillation frequency according to the frequency control amount.

2. The crystal oscillator according to claim 1, further comprising: a conversion circuit; wherein the conversion circuit is configured to convert the first oscillation frequency into a first control signal and convert the frequency control amount into a frequency control signal, and the frequency control circuit is further configured to adjust the first oscillation frequency according to the first control signal and the frequency control signal.

3. The crystal oscillator according to claim 2, wherein the frequency control circuit is further configured to determine an injection control signal according to the first control signal and the frequency control signal, and obtain an adjusted first oscillation frequency according to the injection control signal.

4. The crystal oscillator according to claim 1, further comprising: a first detection circuit configured to detect the current flowing through the crystal.

5. The crystal oscillator according to claim 1, further comprising: a second detection circuit configured to detect the envelope frequency of the current flowing through the crystal.

6. The crystal oscillator according to claim 1, wherein the frequency control circuit is further configured to determine the frequency control amount according to a variation trend of the envelope frequency of the current flowing through the crystal under driven by the first drive signal.

7. The crystal oscillator according to claim 6, wherein if an absolute value of a difference between the first oscillation frequency and a resonant frequency of the crystal is greater than a predetermined threshold, the frequency control amount is decreased to lower the first oscillation frequency; or if the absolute value of the difference between the first oscillation frequency and the resonant frequency of the crystal is less than the predetermined threshold, the frequency control amount is increased to increase the first oscillation frequency.

8. The crystal oscillator according to claim 1, further comprising: a second oscillator circuit bridged at two ends of the crystal; wherein the second oscillator circuit is configured to enable the crystal oscillator to start to oscillate if the first oscillation frequency matches the resonant frequency of the crystal.

9. The crystal oscillator according to claim 8, wherein in the process of adjusting the first oscillation frequency, the second oscillator circuit is in a shutdown state; and the first oscillator circuit and the frequency control circuit are in a shutdown state if the first oscillation frequency matches the resonant frequency of the crystal.

10. A method for adjusting an oscillation frequency, comprising:
    driving a crystal by a first drive signal having a first oscillation frequency;
    determining a frequency control amount according to an envelope frequency of a current flowing through the crystal driven by the first drive signal; and
    adjusting the first oscillation frequency according to the frequency control amount.

11. The method according to claim 10, further comprising:
    converting the first oscillation frequency into a first control signal, and converting the frequency control amount into a frequency control signal;
    wherein, the adjusting the first oscillation frequency according to the frequency control amount comprises: adjusting the first oscillation frequency according to the first control signal and the frequency control signal.

12. The method according to claim 11, wherein the adjusting the first oscillation frequency according to the first control signal and the frequency control signal comprises: determining an injection control signal according to the first control signal and the frequency control signal, and obtaining an adjusted first oscillation frequency according to the injection control signal.

13. The method according to claim 10, wherein the determining a frequency control amount according to the envelope frequency of a current flowing through the crystal driven by the first drive signal comprises: determining the frequency control amount according to a variation trend of the envelope frequency of a current flowing through the crystal driven by the first drive signal.

14. The method according to claim 13, wherein if an absolute value of a difference between the first oscillation frequency and a resonant frequency of the crystal is greater than a predetermined threshold, the frequency control amount is decreased to lower the first oscillation frequency; or if the absolute value of the difference between the first oscillation frequency and the resonant frequency of the crystal is less than the predetermined threshold, the frequency control amount is increased to increase the first oscillation frequency.

15. The method according to claim 10, further comprising: enabling the crystal to start to oscillate if the first oscillation frequency matches the resonant frequency of the crystal.

16. The method according to claim 15, wherein in the process of adjusting the first oscillation frequency, the second oscillator circuit is shut down; and the first oscillator circuit and the frequency control circuit are shut down if the first oscillation frequency matches the resonant frequency of the crystal.

* * * * *